(12) United States Patent
Biswas

(10) Patent No.: US 11,777,491 B1
(45) Date of Patent: Oct. 3, 2023

(54) CONTINUOUS TIME LINEAR EQUALIZER WITH ACTIVE INDUCTOR

(71) Applicant: Cadence Design Systems, Inc., San Jose, CA (US)

(72) Inventor: Riju Biswas, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/896,915

(22) Filed: Aug. 26, 2022

(51) Int. Cl.
*H03K 17/56* (2006.01)
*H04L 27/01* (2006.01)

(52) U.S. Cl.
CPC .............. *H03K 17/56* (2013.01); *H04L 27/01* (2013.01)

(58) Field of Classification Search
CPC ... H03K 17/56; H04L 27/01; H04L 25/03878; H04L 25/03057; H04L 25/03885; H04L 25/0272; H04L 25/03019; H04L 7/0087; H04L 25/03343; H04L 25/4917; H04L 25/03038; H04L 25/03; H04L 25/03146; H03F 1/42; H03F 3/45197; H03F 3/193; H03F 2203/45488; H03F 3/45524; H03F 3/45179; H03F 3/45183; H03F 1/342; H03G 1/0029; H03G 3/001; H03G 3/30; H03G 5/28; H04B 1/123; H03H 11/48; H03M 1/66

See application file for complete search history.

(56) References Cited

U.S. PATENT DOCUMENTS

| 10,116,470 B2* | 10/2018 | Gu ...................... H03F 3/45179 |
| 11,381,208 B1* | 7/2022 | Tam ...................... H03G 1/0029 |
| 2009/0074048 A1* | 3/2009 | Amin ...................... H03H 11/50 333/214 |

* cited by examiner

*Primary Examiner* — John W Poos
*Assistant Examiner* — Tyler J Pereny
(74) *Attorney, Agent, or Firm* — Schwegman Lundberg & Woessner, P.A.

(57) ABSTRACT

Various embodiments provide for a continuous time linear equalizer (CTLE) that includes an active inductor, which can be included in a receiver portion of a circuit. For some embodiments, the CTLE in combination with the active inductor can implement a signal transfer function comprising at least two zeros and two poles.

18 Claims, 10 Drawing Sheets

CONTINUOUS TIME LINEAR EQUALIZER WITH ACTIVE INDUCTOR

TECHNICAL FIELD

Embodiments described herein relate to circuits and, more particularly, to a continuous time linear equalizer (CTLE) that includes an active inductor.

BACKGROUND

A signal receiver circuit, which can facilitate data communications within or between electronic devices, often rely on one or more signal equalization components to address or compensate for one or more impairments (e.g., inter-symbol interference (ISI), noise, jitter, etc.) present within a signal received by the signal receiver circuit. For example, a receiver portion of a circuit that implements a high-speed serial data link can include and use a continuous time linear equalizer (CTLE). In such an application, the receiver portion can use the CTLE to receive an input signal and generate an output signal that represents the input signal at a peaking amplitude when the input signal is at Nyquist frequency of the receiver portion (e.g., a frequency of Fs/2, where Fs is the sampling rate or frequency of the receiver portion). In doing so, the CTLE can boost integrity of digital data carried by a received signal (e.g., high-frequency signal received by the receiver portion).

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
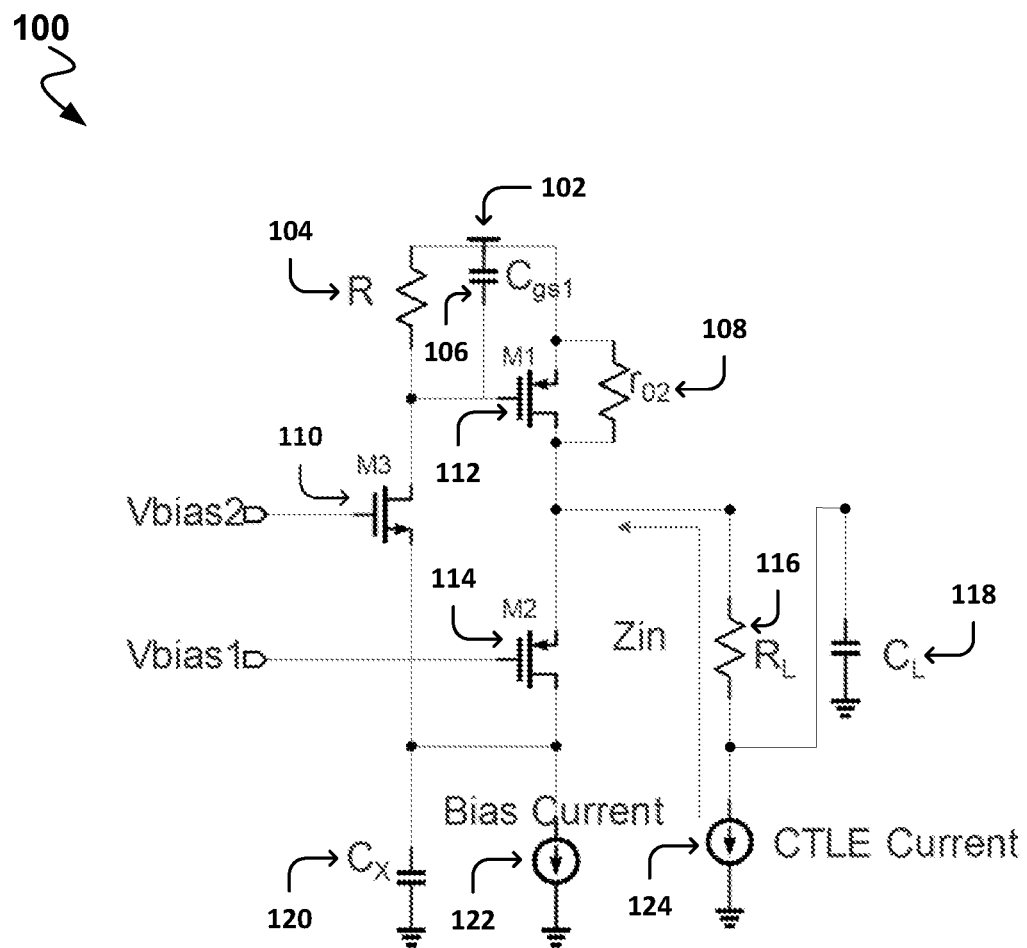
FIG. 1 is a schematic illustrating an example active inductor of a continuous time linear equalizer (CTLE), in accordance with various embodiments.

Various embodiments provide for a continuous time linear equalizer (CTLE) that includes an active inductor, which can be included in a receiver portion of a circuit. In particular, for some embodiments, the CTLE in combination with the active inductor can implement a signal transfer function (or transfer function) comprising at least two zeros and two poles. For instance, an embodiment can provide a CTLE with an active inductor having a transfer function that includes two zeros and three poles, where the active inductor can at least implement the two zeros and two of the poles of the transfer function. In doing so, various embodiments described herein can generate an improved output signal response (e.g., alternative current (AC) response) in comparison to traditional CTLE technologies.

Generally, as the speed of serial data links increases, so does the Nyquist frequency of a receiver portion of a circuit. In order for the CTLE of traditional receivers to meet a peaking amplitude at Nyquist frequency, the power consumed by the CTLE is increased. Unfortunately, at some point increasing power will make it harder for the receiver to achieve a desired bandwidth (e.g., as the input signal pair will start to do self-loading). To compensate, some traditional technologies use passive inductors to increase the bandwidth. This can present a drawback as well, as passive inductors use a large amount of circuit area to implement.

A CTLE of some embodiments include an active inductor to provide the CTLE implementing a transfer function that has at least two zeros and two poles. For instance, some embodiments provide for a CTLE with an active inductor implementing a transfer function having two zeros and three poles, where at least two zeroes and two poles are provided by (e.g., the alternating current (AC) response of) the active inductor and the remaining pole is a load pole provided by the CTLE. For example, the load pole can comprise $1/(R_L*C_L)$, where $R_L$ represents a resistance of the load of CTLE and $C_L$ represents a capacitance of the load of the CTLE. With respect to input signal of the CTLE's transfer function, the two zeros and three poles can be such that the input signal frequency associated with the load pole falls between the input signal frequencies respectively associated with the two zeros. Additionally, the input signal frequencies associated with both poles provided by the active inductor can follow after the input signal frequency associated with second zero. Examples of these characteristics are illustrated and described herein with respect to FIGS. 5 through 7. According to some embodiments, the active inductor further includes an operational amplifier that enables the input signal frequency associated with one of the poles provided by the active inductor to be pushed further out, which can effectively increase the bandwidth of the CTLE. An example of this characteristic is illustrated and described herein with respect to FIG. 7.

As used herein, an active inductor of a CTLE can represent a portion (e.g., active inductor portion) of a circuit design that implements technical features of the active inductor as described herein. For various embodiments, the active inductor portion a CTLE operatively couples between an equalizer portion of the CTLE and a power source of the CTLE. Accordingly, the equalizer portion of the CTLE represents the load of the active inductor provides power. The equalizer portion of the CTLE can represent one or more remaining portions of the CTLE that implement continuous time linear equalization functionality. Compared to conventional technologies, a CTLE of an embodiment described herein can not only provide increased peaking amplitude at Nyquist frequency (e.g., of the receiver), but can also provide increased bandwidth.

As used herein, a signal transfer function (or transfer function) can refer to a function that describes a relationship between an input signal value (e.g., measured in frequency) received by a signal system (e.g., implemented by CTLE) and an output signal value (e.g., measured in frequency) generated and outputted by the signal system based on the input signal value. As used herein, zeros of the transfer function are input signal values (e.g., input signal frequencies) for which the transfer function outputs zero as the output signal value (e.g., output signal frequency of zero). As used herein, poles of the transfer function are input signal values (e.g., input signal frequencies) for which the transfer function outputs infinity as the output signal value (e.g., denominator portion of the transfer function becomes zero).

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a schematic illustrating an example active inductor 100 of a CTLE, in accordance with various embodiments. As shown, the active inductor 100 is operatively coupled to a power source 102, which can represent a power source for the CTLE. The active inductor 100 comprises a capacitor 106 ($C_{gs1}$), a transistor device 112 (M1), a resistor 108 ($r_{o2}$) that represents the resistance of the transistor device 112, and a transistor device 114 (M2). The active inductor 100 further comprises a resistor 104 (R), a transistor device 110 (M3), and a capacitor 120 ($C_x$), which can implement a feedback path within the active inductor 100. The active inductor 100 can be operatively coupled to the CTLE between the source of the transistor device 112 (M1) and the drain of the transistor device 114 (M2), and Zin can represent the transfer function of a CTLE operatively coupled to the active inductor 100. Resistor 116 ($R_L$) and capacitor 118 ($C_L$) can respectively represent the resistance and the capacitance of the load of the CTLE. The active inductor 100 receives as input two voltage biases (Vbias1 and Vbias2), which can control operation of the active inductor 100 and cause the active inductor 100 to generate a current to the CTLE (CTLE current 124). For some embodiments, the two voltages biases can control positioning of (e.g., input signal frequencies associated with) the two poles provided by the active inductor 100 to the transfer function of the CTLE. Bias current 122 can represent bias current flowing through the active inductor 100.

According to various embodiments, the inclusion of the active inductor 100 with respect to a CTLE can result in the following transfer function (Function 1) for the CTLE:

$$Zin \sim \frac{(1 + sCgs1*R)*\left(1 + s\frac{Cx}{gm3}\right)}{gm1*gm2*R*\left(1 + \frac{s}{Wp1}\right)*\left(1 + \frac{s}{Wp2}\right)*\left(1 + \frac{s}{Wp3}\right)}$$

where $W_{p1}$ represents a frequency associated with a first pole and is determined as $W_{p1}=g_{m1}/C_{gs1}$, where $W_{p2}$ represents a frequency associated with a second pole and is determined as $W_{p2}=g_{m2}/C_{gd1}$, where $W_{p3}$ represents a frequency associated with a third pole and is determined as $W_{p3}=g_{m1}*(g_{m3}*R)/C_X$ (provided by the feedback path of the active inductor 100), where $W_{z1}$ represents a frequency associated with a first zero and is determined as $W_{z1}=1/C_{gs1}*R$ (where adjusting or tuning the resistance value of R can adjust/tune the frequency associated with the first zero), and where $W_{z2}$ represents a frequency associated with a second zero and is determined as $W_{z2}=g_{m3}/C_x$. The resistance value of the resistor 104 (R) can adjust or tune the positioning (e.g., frequency value) of the first zero provided by the active inductor 100, and the capacitance value of the capacitor 120 ($C_x$) can adjust or tune the positioning (e.g., frequency value) of the second zero provided by the active inductor 100.

During operation of the active inductor 100, the bias and the CTLE currents 122, 124 flow through the transistor device 112 (M1). For some embodiments, $g_{m1}>>g_{m2},g_{m3}$, $C_{gs1}>C_{gd1}$, and $g_{m1}/C_{gs1}\sim g_{m2}/C_{gd1}$. Depending on the embodiment, the capacitor 120 ($C_X$) can be a metal capacitor, and can be selected such that the frequency of the second zero ($W_{z2}$) is less than (e.g., positioned before) the respective frequencies of the first pole ($W_{p1}$) and the second pole ($W_{p2}$).

Figure 2:
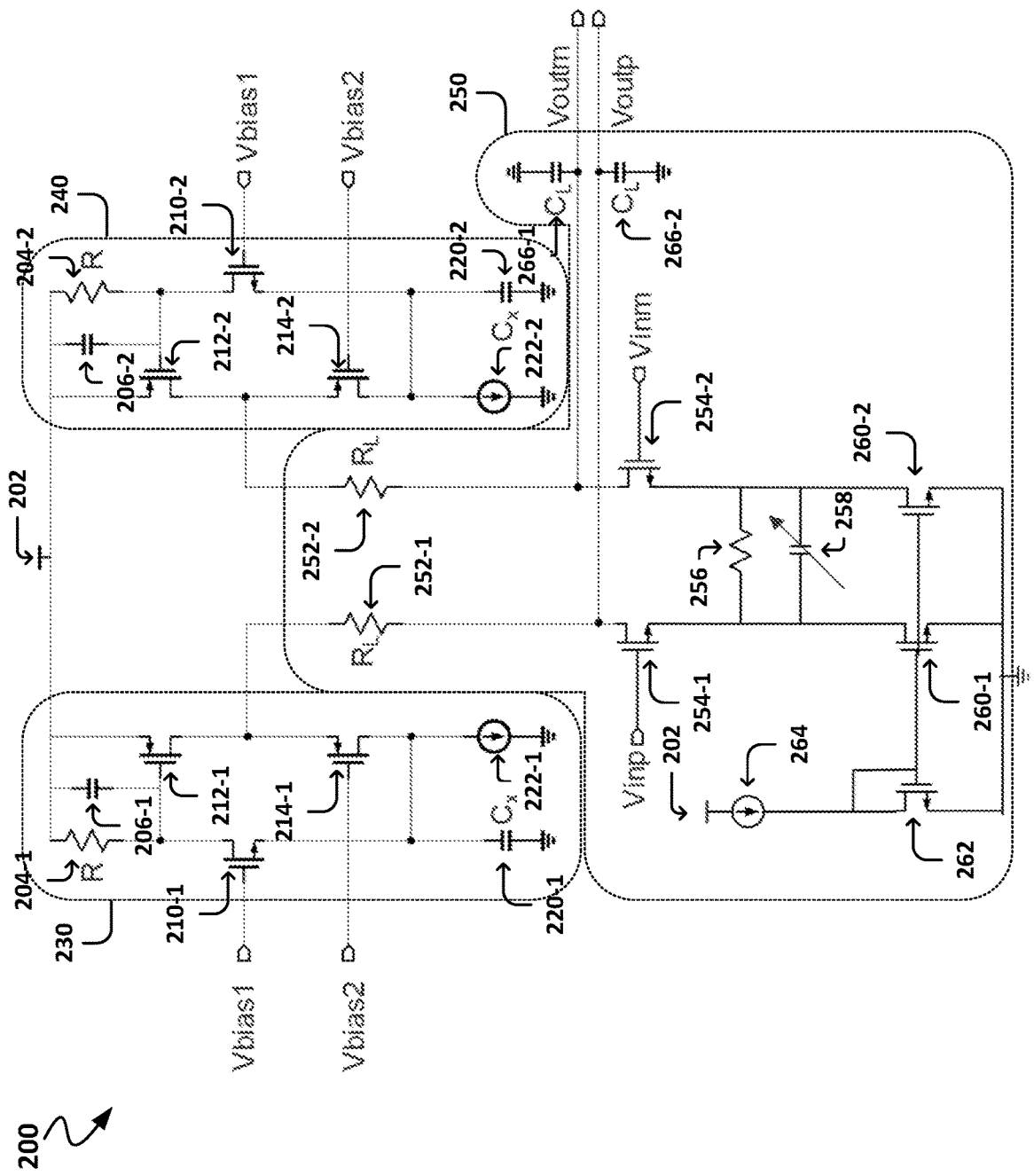
FIG. 2 is a schematic illustrating an example CTLE that comprises an equalizer portion and an active inductor portion including instances of an active inductor, in accordance with various embodiments.

FIG. 2 is a schematic illustrating an example CTLE 200 that comprises an equalizer portion 250 and an active inductor portion including two instances 230, 240 of the active inductor 100 of FIG. 1. According to various embodiments, components 204-1, 206-1, 210-1, 212-1, 214-1, 220-1, 222-1 of instance 230 are respectively similar to components 104, 106, 110, 112, 114, 120, 122 of the active inductor 100 of FIG. 1 and, likewise, components 204-2, 206-2, 210-2, 212-2, 214-2, 220-2, 222-2 of instance 240 are respectively similar to components 104, 106, 110, 112, 114, 120, 122 of the active inductor 100 of FIG. 1.

As shown, the equalizer portion 250 receives a differential input signal via a positive input Vinp and a negative input Vinm, and the equalizer portion 250 outputs a differential output signal (generated based on the received differential input signal) via a positive output Voutp and a negative output Voutm. The equalizer portion 250 comprises load resistors 252-1, 252-2, transistor devices 254-1, 254-2, 260-1, 260-2, 262, load capacitors 266-1, 266-2, a resistor 256, and a capacitor 258. In FIG. 2, the load resistor 252-1, the transistor devices 254-1, 260-1, and the load capacitor 266-1 can represent a positive input signal portion of the equalizer portion 250, while the load resistor 252-2 the transistor devices 254-2, 260-2, and the load capacitor 266-2 can represent a negative input signal portion of the equalizer portion 250. The resistor 256 and the capacitor 258 operatively couple together the positive and the negative portions. For various embodiments, the peaking amplitude provided (e.g., generated) by the CTLE 200 at Nyquist frequency is adjusted by varying the capacitance value of the capacitor 258. The equalizer portion receives power from the power source 202, which provides a current 264 to the lower transistor devices 260-1, 260-2, 262 of the equalizer portion 250. It will be understood that the equalizer portion 250 represents one type of implementation of an equalizer portion of the CTLE 200, and can differ other embodiments of the current disclosure.

As also shown, each of the instances 230 and 240 operatively couple the equalizer portion 250 of the CTLE 200 to a power source 202, with the instance 230 operatively coupling (and powering) the positive input signal portion of the equalizer portion 250 to the power source 202 and the instance 240 operatively coupling (and powering) the negative input signal portion of the equalizer portion 250 to the power source 202. For some embodiments, the load pole of the transfer function of the positive portion of the CTLE 200 is determined (e.g., as $1/(R_L*C_L)$) based on the resistance value of the load resistor 252-1 and the capacitance value of the load capacitor 266-1, and the load pole of the transfer function of the negative portion of the CTLE 200 is determined based on the resistance value of the load resistor 252-2 and the capacitance value of the load capacitor 266-2. Further, the instance 230 provides two zeros ($W_{z1}$ and $W_{z2}$) and two additional poles ($W_{p1}$ and $W_{p2}$) to the transfer function of the positive portion of the CTLE 200, while the instance 240 provides two zeros and two additional poles to the transfer function of the negative portion of the CTLE 200.

Figure 3:
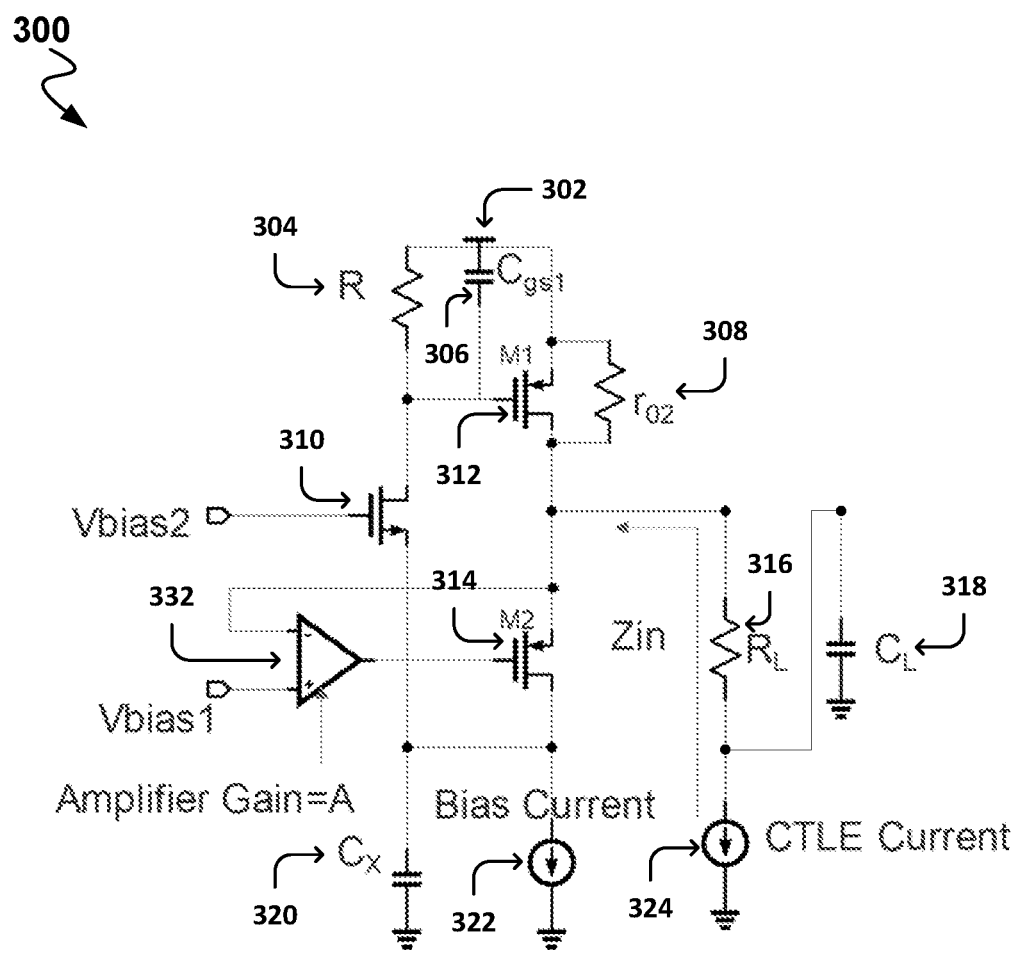
FIG. 3 is a schematic illustrating an example active inductor of a CTLE, in accordance with various embodiments.

FIG. 3 is a schematic illustrating another example active inductor 300 of a CTLE, in accordance with various embodiments. In comparison to the active inductor 100 of FIG. 1, the active inductor 300 includes an operational amplifier 332, which can increase the bandwidth of a CTLE of some embodiments.

As shown, the active inductor 300 is operatively coupled to a power source 302, which can represent a power source for the CTLE. The active inductor 300 comprises a capacitor 306 ($C_{gs1}$), a transistor device 312 (M1), a resistor 308 ($r_{o2}$) that represents the resistance of the transistor device 312, and a transistor device 314 (M2). The active inductor 300 comprises a resistor 304 (R), a transistor device 310 (M3), and a capacitor 320 ($C_x$), which can implement a feedback path within the active inductor 300. Additionally, the active inductor 300 also comprises the operational amplifier 332 having an output operatively coupled to a gate of the transistor device 314 (M2). In FIG. 3, the operational amplifier 332 comprises a positive input configured to receive one (Vbias1) of the two input voltage biases (Vbias1, Vbias2) and a negative input operatively coupled between the source of the transistor device 312 (M1) and the drain of the transistor device 314 (M2). The operational amplifier 332 can be configured to provide an amplifier gain of A. According to various embodiments, the operational amplifier 332 improves the transconductance of the transistor device 314 (M2).

The active inductor 300 can be operatively coupled to the CTLE between the source of the transistor device 312 (M1) and the drain of the transistor device 314 (M2), and Zin can represent the transfer function of a CTLE operatively coupled to the active inductor 300. Resistor 316 ($R_L$) and capacitor 318 ($C_L$) can respectively represent the resistance and the capacitance of the load of the CTLE. The active inductor 300 receives as input two voltage biases (Vbias1 and Vbias2), which can control operation of the active inductor 300 and cause the active inductor 300 to generate a current to the CTLE (CTLE current 324). For some embodiments, the two voltages biases can control positioning of (e.g., input signal frequencies associated with) the two poles provided by the active inductor 300 to the transfer function of the CTLE. Bias current 322 can represent bias current flowing through the active inductor 300.

According to various embodiments, the inclusion of the active inductor 300 with respect to a CTLE can result in a similar transfer function as the Function 1 active inductor 100 but at least one different pole calculation. Specifically, for some embodiments, the inclusion of the active inductor 300 with respect to a CTLE can result in the following transfer function (Function 2) for the CTLE:

$$Zin \sim \frac{(1 + sCgs1 * R) * \left(1 + s\frac{Cx}{gm3}\right)}{gm1 * gm2 * R * \left(1 + \frac{s}{Wp1}\right) * \left(1 + \frac{s}{Wp2}\right) * \left(1 + \frac{s}{Wp3}\right)}$$

where $W_{p1}$ represents a frequency associated with a first pole and is determined as $W_{p1}=g_{m1}/C_{gs1}$, where $W_{p2}$ represents a frequency associated with a second pole and is determined as $W_{p2}=A*g_{m2}/C_{gd1}$ (where A is the value of the amplifier gain of the operational amplifier 332), where $W_{p3}$ represents a frequency associated with a third pole and is determined as $W_{p3}=g_{m1}*(g_{m3}*R)/C_X$ (provided by the feedback path of the active inductor 100), where $W_{z1}$ represents a frequency associated with a first zero and is determined as $W_{z1}=1/C_{gs1}*R$ (where adjusting or tuning the resistance value of R can adjust/tune the frequency associated with the first zero), and where $W_{z2}$ represents a frequency associated with a second zero and is determined as $W_{z2}=g_{m3}/C_x$. By causing the implementation of Function 2, the CTLE can push out the second pole ($W_{p2}$) using the amplifier gain of the operational amplifier 332 to increase the overall bandwidth of the CTLE. The resistance value of the resistor 104 (R) can adjust or tune the positioning (e.g., frequency value) of the first zero provided by the active inductor 100, and the capacitance value of the capacitor 120 ($C_x$) can adjust or tune the positioning (e.g., frequency value) of the second zero provided by the active inductor 100.

During operation of the active inductor 300, the bias and the CTLE currents 322, 324 flow through the transistor device 312 (M1). For some embodiments, $g_{m1} \gg g_{m2}, g_{m3}$, $C_{gs1} > C_{gd1}$, and $g_{m1}/C_{gs1} \sim g_{m2}/C_{gd1}$. Depending on the embodiment, the capacitor 320 ($C_X$) can be a metal capacitor, and can be selected such that the frequency of the second zero ($W_{z2}$) is less than (e.g., positioned before) before the respective frequencies of the first pole ($W_{p1}$) and the second pole ($W_{p2}$).

Figure 4:
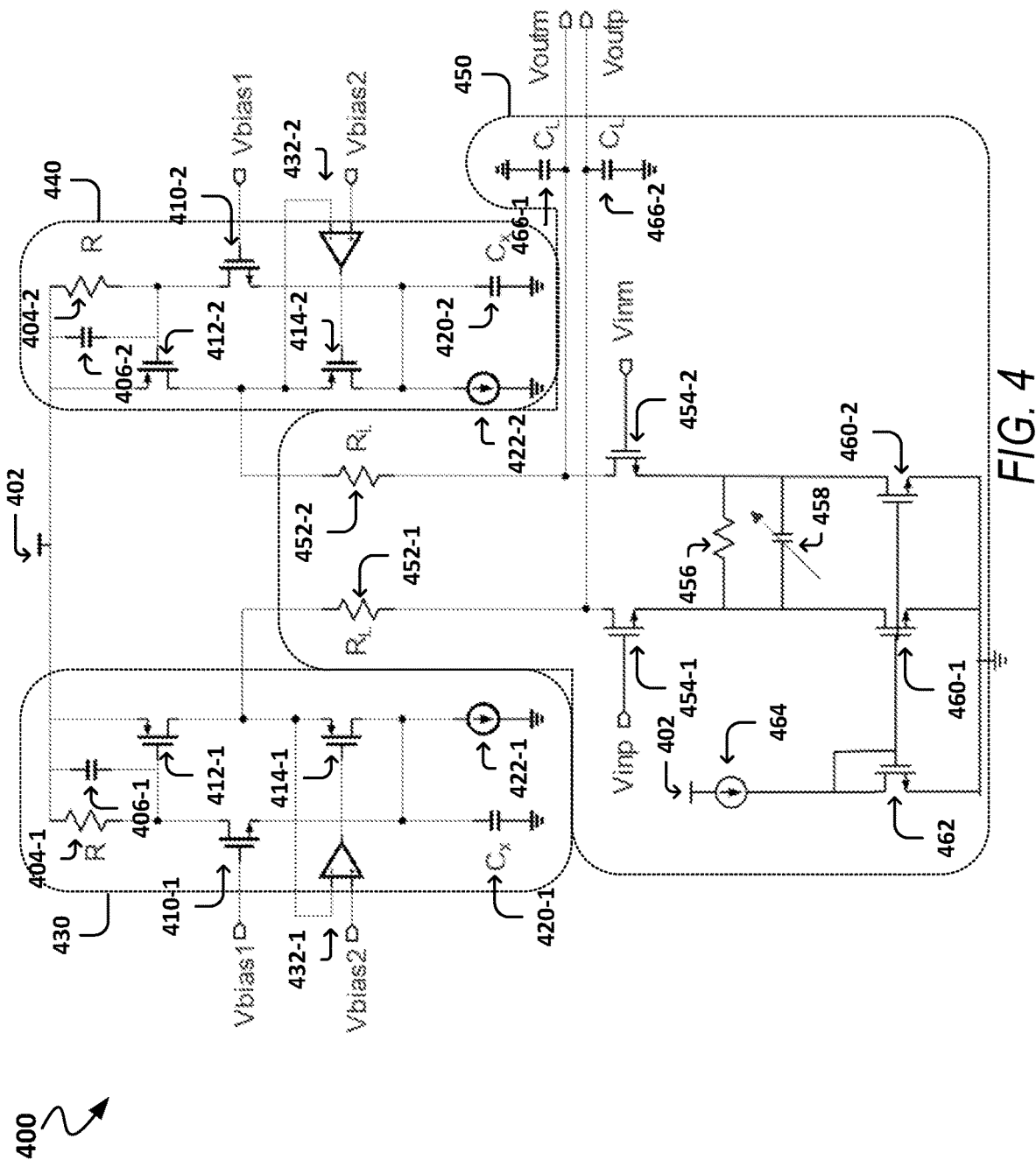
FIG. 4 is a schematic illustrating an example CTLE that comprises an equalizer portion and an active inductor portion including instances of an active inductor, in accordance with various embodiments.

FIG. 4 is a schematic illustrating an example CTLE 400 comprises that comprises an equalizer portion 450 and an active inductor portion including two instances 430, 440 of the active inductor 300 of FIG. 3. According to various embodiments, components 404-1, 406-1, 410-1, 412-1, 414-1, 420-1, 422-1, 432-1 of instance 430 are respectively similar to components 304, 306, 310, 312, 314, 320, 322, 332 of the active inductor 300 of FIG. 3 and, likewise, components 404-2, 406-2, 410-2, 412-2, 414-2, 420-2, 422-2, 432-2 of instance 440 are respectively similar to components 304, 306, 310, 312, 314, 320, 322, 332 of the active inductor 300 of FIG. 3.

As shown, the equalizer portion 450 receives a differential input signal via a positive input Vinp and a negative input Vinm, and the equalizer portion 450 outputs a differential output signal (generated based on the received differential input signal) via a positive output Voutp and a negative output Voutp. The equalizer portion 450 comprises load resistors 452-1, 452-2, transistor devices 454-1, 454-2, 460-1, 460-2, 462, load capacitors 466-1, 466-2, a resistor 456, and a capacitor 458. In FIG. 4, the load resistor 452-1, the transistor devices 454-1, 460-1, and the load capacitor 466-1 can represent a positive input signal portion of the equalizer portion 450, while the load resistor 452-2 the transistor devices 454-2, 460-2, and the load capacitor 466-2 can represent a negative input signal portion of the equalizer portion 450. The resistor 456 and the capacitor 458 operatively couple together the positive and the negative portions. For various embodiments, the peaking amplitude provided (e.g., generated) by the CTLE 400 at Nyquist frequency is adjusted by varying the capacitance value of the capacitor 458. The equalizer portion receives power from the power source 402, which provides a current 464 to the lower transistor devices 460-1, 460-2, 462 of the equalizer portion 450. It will be understood that the equalizer portion 450 represents one type of implementation of an equalizer portion of the CTLE 400, and can differ other embodiments of the current disclosure.

As also shown, each of the instances 430 and 440 operatively couple the equalizer portion 450 of the CTLE 400 to a power source 402, with the instance 430 operatively coupling (and powering) the positive input signal portion of the equalizer portion 450 to the power source 402 and the instance 440 operatively coupling (and powering) the negative input signal portion of the equalizer portion 450 to the power source 402. For some embodiments, the load pole of the transfer function of the positive portion of the CTLE 400 is determined (e.g., as $1/(R_L*C_L)$) based on the resistance value of the load resistor 452-1 and the capacitance value of the load capacitor 466-1, and the load pole of the transfer function of the negative portion of the CTLE 400 is determined based on the resistance value of the load resistor 452-2 and the capacitance value of the load capacitor 466-2. Further, the instance 430 provides two zeros ($W_{z1}$ and $W_{z2}$) and two additional poles ($W_{p1}$ and $W_{p2}$) to the transfer function of the positive portion of the CTLE 400, while the instance 440 provides two zeros and two additional poles to the transfer function of the negative portion of the CTLE 400.

Figure 5:
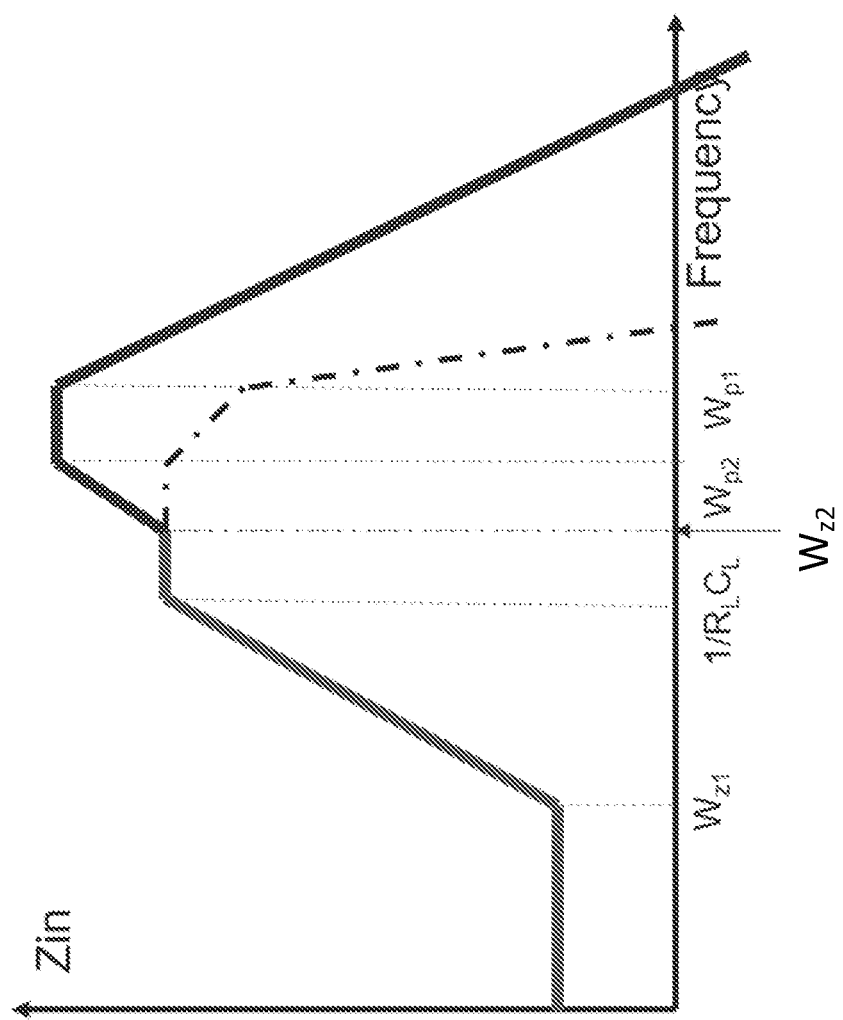
FIGS. 5 through 7 illustrate graphs of example transfer functions of CTLEs, in accordance with various embodiments.

FIG. 5 illustrates a graph 500 of the transfer function Function 1 (Zin as a function of input signal frequency) of the CTLE 200 and its included zeros and poles, in accordance with various embodiments. As shown, the first zero ($W_{z1}$) of Function 1 is associated with a lower frequency than that of the load pole ($1/(R_L*C_L)$) of Function 1, and the load pole ($1/(R_L*C_L)$) is associated with a lower frequency than that of the second zero ($W_{z2}$) of Function 1, thereby placing the load pole ($1/(R_L*C_L)$) between the two zeros in the graph. As also shown, the second zero ($W_{z2}$) is associated with a lower frequency than that of the second pole ($W_{p2}$) of Function 1, and the second pole ($W_{p2}$) is associated with a lower frequency than that of the first pole ($W_{p1}$) of Function 1, thereby resulting the second zero being position before (e.g., lower) than both the first and the second poles.

Figure 6:
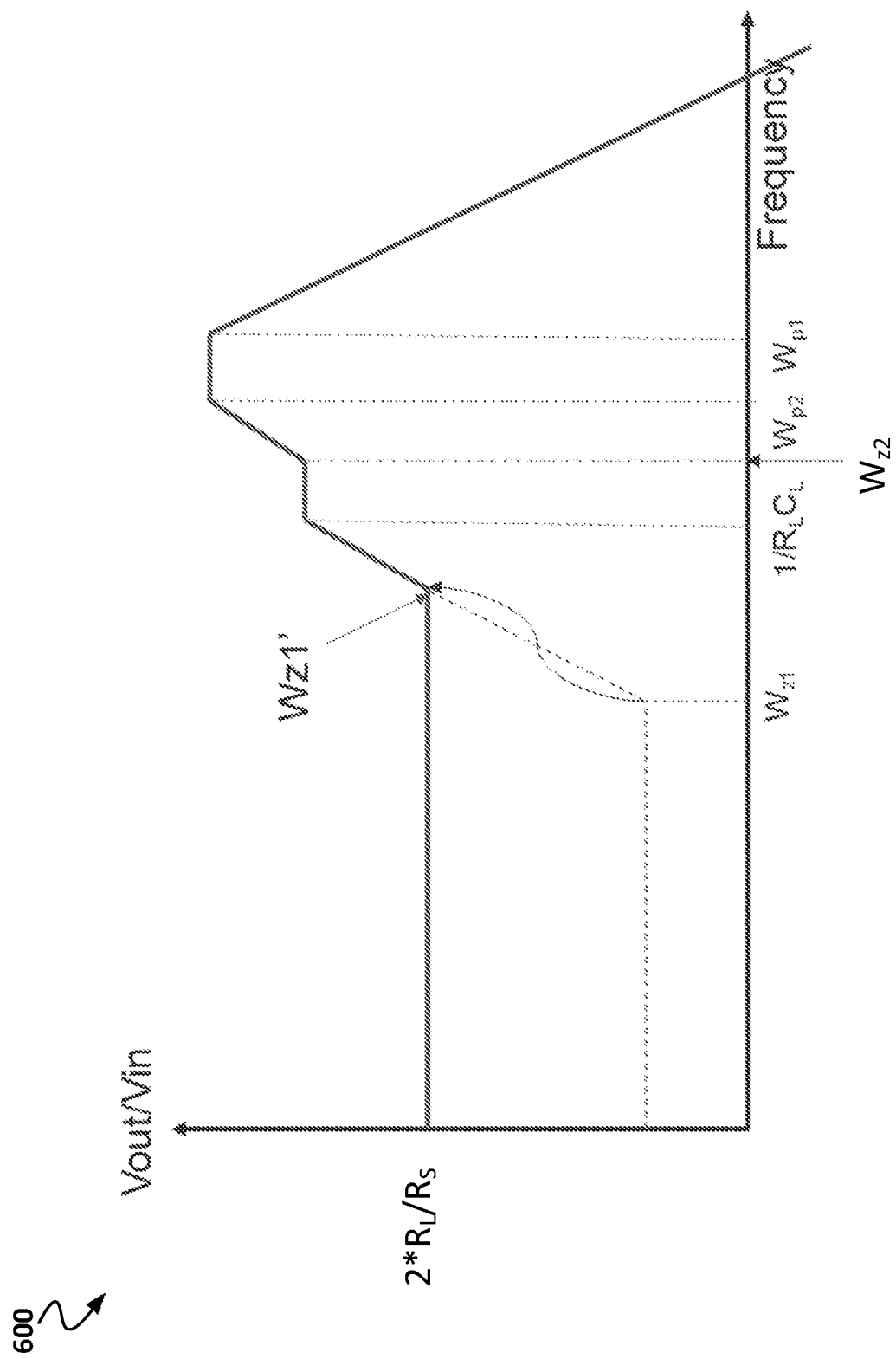

FIG. 6 illustrates a graph 600 of the transfer function Function 1 (Zin as a function of input signal frequency) of the CTLE 200 where the first zero ($W_{Z1}$) is redefined as $W_{Z1}'$ based on the resistance value of a source resistor ($R_S$) and the capacitance value of a peaking capacitance ($C_{PEAK}$). In particular, $W_{Z1}'$ can be defined as: $W_{Z1}'=1/(R_S*C_{PEAK})$. As a result, the overall peaking of the CTLE 200 can be determined (e.g., defined) by the peaking capacitance ($C_{PEAK}$), while the overall bandwidth of the CTLE 200 can be determined (e.g., defined) by the active inductor portion of the CTLE 200.

Figure 7:
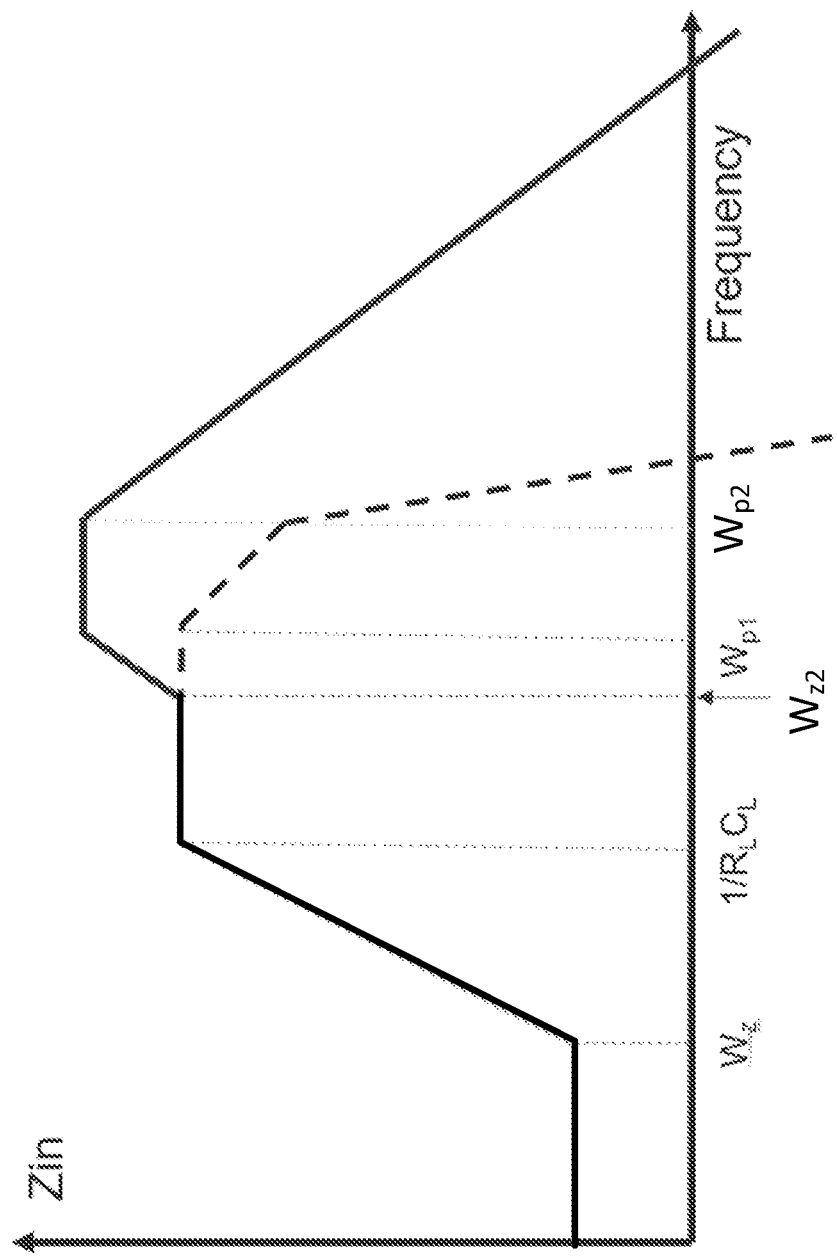

FIG. 7 illustrates a graph 700 of the transfer function Function 2 (Zin as a function of input signal frequency) of the CTLE 400 of FIG. 4 and its included zeros and poles, in accordance with various embodiments. Similar to the graph 500 of Function 1, the graph 700 of Function 2 illustrates the first zero ($W_{z1}$) of Function 2 is associated with a lower frequency than that of the load pole ($1/(R_L*C_L)$) of Function 2, and the load pole ($1/(R_L*C_L)$) is associated with a lower frequency than that of the second zero ($W_{z2}$) of Function 2, thereby placing the load pole ($1/(R_L*C_L)$) between the two zeros in the graph. However, in contrast to the graph 500 of Function 1, the graph 700 of Function 2 illustrates that the second zero ($W_{z2}$) is associated with a lower frequency than that of the first pole ($W_{p1}$) of Function 2, and the first pole ($W_{p1}$) is associated with a lower frequency than that of the second pole ($W_{p2}$) of Function 2. While this results in the second zero of Function 2 being positioned before (e.g., lower than) both the first and the second poles (like Function 1), unlike the graph 500 of Function 1, the graph 700 of Function 2 illustrates the second pole ($W_{p2}$) as being positioned after the first pole ($W_{p1}$) and effectively pushed out further in the frequency domain. According to various embodiments, this provides the CTLE 400 of FIG. 4 with more bandwidth in comparison to the CTLE 200 of FIG. 2. As noted herein, the repositioning/pushing out of the second pole ($W_{p2}$) can be implemented by use of an operational amplifier with one of the input voltage biases of the active inductor (e.g., operational amplifier 332 of FIG. 3).

Figure 8:
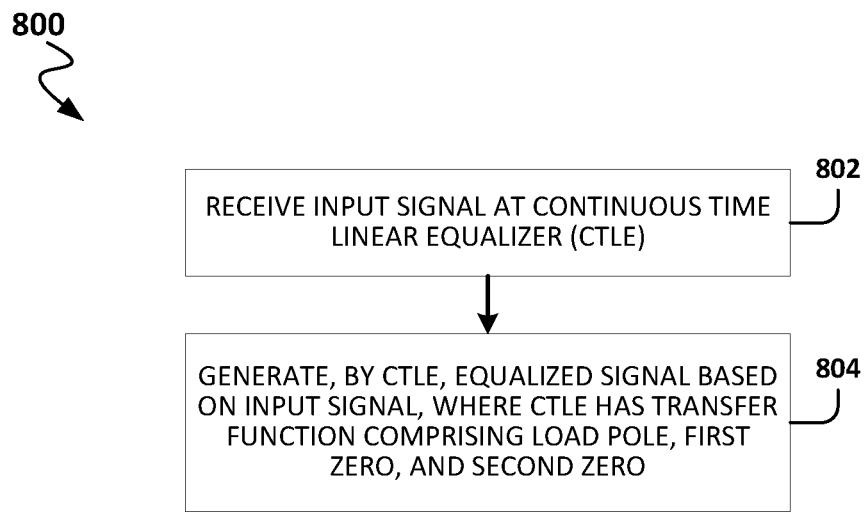
FIG. 8 is a flowchart illustrating an example method for a CTLE with an active inductor, in accordance with various embodiments.

FIG. 8 is a flowchart illustrating an example method 800 for a CTLE with an active inductor, in accordance with various embodiments. Some or all of the method 800 can be performed by a circuit, such as one or more of the circuits/components described herein with respect to FIGS. 1 through 4. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

At operation 802, an input signal is received at a CTLE (e.g., 200). For some embodiments, the input signal comprises a differential input signal. Thereafter, at operation 804, an equalized signal is generated by CTLE based on the input signal, where the CTLE has a transfer function that comprises a load pole, a first zero, and a second zero. The equalizer signal generated by the CTLE can comprise a differential output signal.

According to various embodiments, the continuous time linear equalizer comprises an equalizer portion and an active inductor portion, where the active inductor portion operatively couples a load of the equalizer portion to a current source, where the active inductor portion is configured to implement the first zero and the second zero of the transfer function, and where the equalizer portion is configured to implement the load pole of the transfer function. The first zero can be associated with a first input frequency of the transfer function, the second zero can be associated with a second input frequency of the transfer function, the load pole can be associated with a third input frequency of the transfer function, the first input frequency can be less than the third input frequency, and the third input frequency can be less than the second input frequency.

For some embodiments, the load pole is a first pole, the transfer function comprises a second pole and a third pole, and the active inductor portion is configured to implement the second pole and the third pole. For instance, the first zero can be associated with a first input frequency of the transfer function, the second zero can be associated with a second input frequency of the transfer function, the first pole can be associated with a third input frequency of the transfer function, the second pole can be associated with a fourth input frequency of the transfer function, the third pole can be associated with a fifth input frequency of the transfer function, the first input frequency can be less than the third input frequency, the third input frequency can be less than the second input frequency, and the second input frequency can be less than the fourth input frequency and the fifth input frequency. Examples of this are illustrated and described with respect to FIGS. 5 through 7.

The active inductor portion can comprise a transistor device, a resistor, and a capacitor, where the transistor device, the resistor, and the capacitor implement a feedback path in the active inductor portion. Additionally, the active inductor portion can comprise a first transistor device, a second transistor device, a third transistor device, a resistor, and a capacitor, where a gate of the second transistor device is configured to receive a first input voltage bias, where a gate of the third transistor device is configured to receive a second input voltage bias, and where the third transistor device, the resistor, and the capacitor implement a feedback path in the active inductor portion. For instance, a drain of the first transistor device can be operatively coupled to a power source, a source of the first transistor device can be operatively coupled to a drain of the second transistor device and to the load of the equalizer portion, a source of the second transistor device can be operatively coupled to a drain of the third transistor device and to the capacitor, and a source of the third transistor device can be operatively coupled to the resistor and to a gate of the first transistor device. An example of this is illustrated and described with respect to FIGS. 1 and 2.

Further, the active inductor portion can comprise a first transistor device, a second transistor device, a third transistor device, a resistor, a capacitor, and a differential amplifier, where a drain of the first transistor device can be operatively coupled to a power source, where a source of the first transistor device can be operatively coupled to a drain of the second transistor device, to a negative input of the differential amplifier, and to the load of the equalizer portion, where a positive input of the differential amplifier can be configured to receive a first input voltage bias, where a gate of the second transistor device of operatively coupled to an output of the differential amplifier, where a source of the second transistor device can be operatively coupled to a drain of the third transistor device and to the capacitor, and where a source of the third transistor device can be operatively coupled to the resistor and a gate of the first transistor device.

Figure 9:
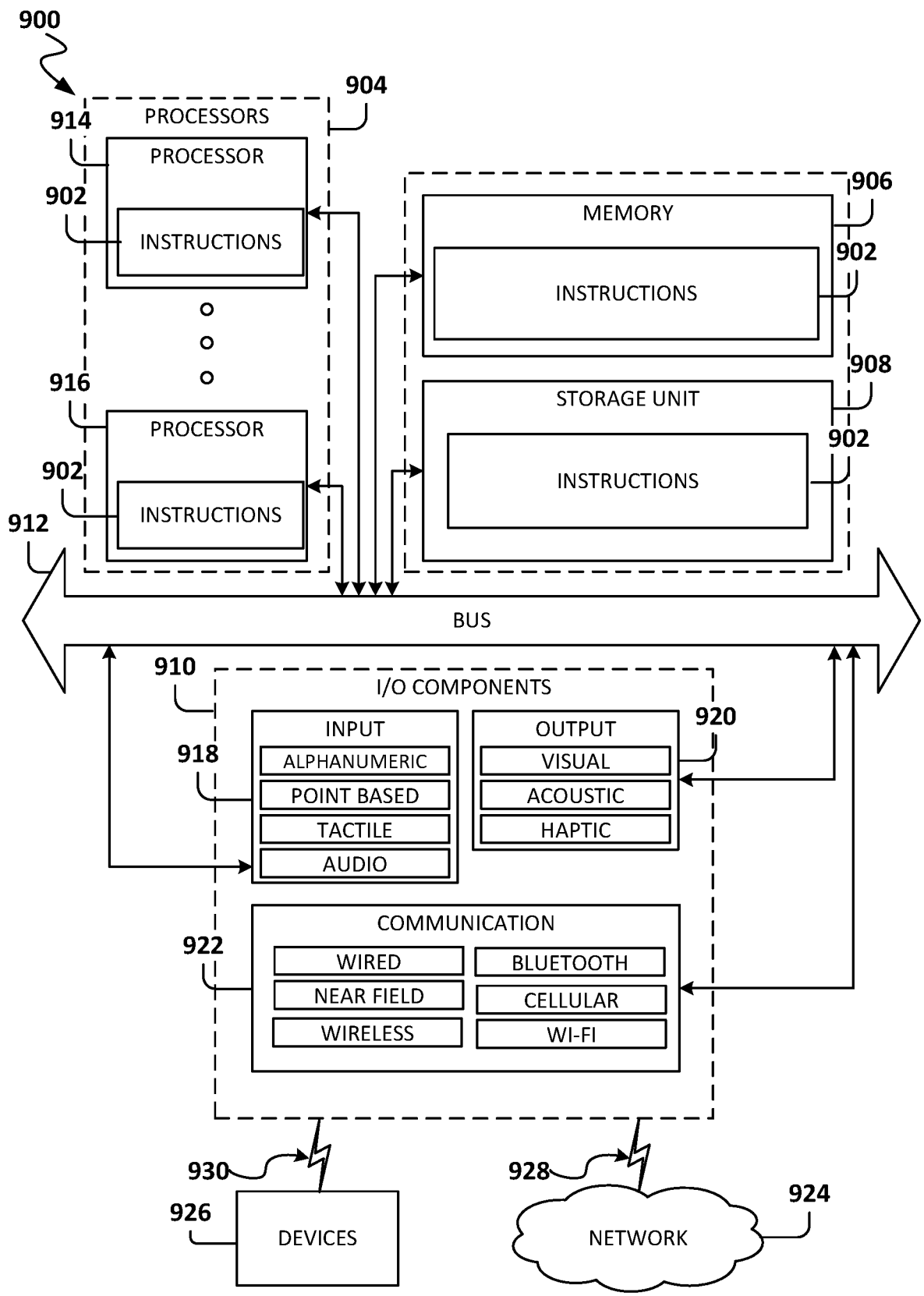
FIG. 9 is a block diagram illustrating components of a machine, according to some example embodiments, able to read instructions from a machine-readable medium and perform any one or more of the methodologies discussed herein.

FIG. 9 is a block diagram illustrating components of a machine 900, according to some example embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a system within which instructions 902 (e.g., software, a program, an application, an applet, an app, a driver, or other executable code) for causing the machine 900 to perform any one or more of the methodologies discussed herein may be executed. For example, the instructions 902 include executable code that causes the machine 900 to execute a method (e.g., of an electronic design automation (EDA) system or tool) for implementing a CTLE (e.g., 200 or 400) described herein within a larger circuit design. In this way, these instructions 902 transform the general, non-programmed machine 900 into a particular machine programmed to carry out the described method in the manner described herein. The machine 900 may operate as a standalone device or may be coupled (e.g., networked) to other machines.

By way of non-limiting example, the machine 900 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 902, sequentially or otherwise, that specify actions to be taken by the machine 900. Further, while only a single machine 900 is illustrated, the term "machine" shall also be taken to include a collection of machines 900 that individually or jointly execute the instructions 902 to perform any one or more of the methodologies discussed herein.

The machine 900 may include processors 904, memory 906, a storage unit 908, and I/O components 910, which may be configured to communicate with each other such as via a bus 912. In an example embodiment, the processors 904 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 914 and a processor 916 that may execute the instructions 902. The term "processor" is intended to include multi-core processors 904 that may comprise two or more independent processors (sometimes referred to as "cores") that may execute instructions 902 contemporaneously. Although FIG. 9 shows multiple processors 904, the machine 900 may include a single processor with a single core, a single processor with multiple cores (e.g., a multi-core processor), multiple processors with a single core, multiple processors with multiple cores, or any combination thereof.

The memory 906 (e.g., a main memory or other memory storage) and the storage unit 908 are both accessible to the processors 904 such as via the bus 912. The memory 906 and the storage unit 908 store the instructions 902 embodying any one or more of the methodologies or functions described herein. The instructions 902 may also reside, completely or partially, within the memory 906, within the storage unit 908, within at least one of the processors 904 (e.g., within the processor's cache memory), or any suitable combination thereof, during execution thereof by the machine 900. Accordingly, the memory 906, the storage unit 908, and the memory of the processors 904 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 902. The term "machine-readable medium" shall also be taken to include any medium, or combination of multiple media, that is capable of storing instructions (e.g., instructions 902) for execution by a machine (e.g., machine 900), such that the instructions, when executed by one or more processors of the machine (e.g., processors 904), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 910 may include a wide variety of components to receive input, provide output, produce output, transmit information, exchange information, capture measurements, and so on. The specific I/O components 910 that are included in a particular machine 900 will depend on the type of the machine 900. For example, portable machines such as mobile phones will likely include a touch input device or other such input mechanisms, while a headless server machine will likely not include such a touch input device. It will be appreciated that the I/O components 910 may include many other components that are not specifically shown in FIG. 9. The I/O components 910 are grouped according to functionality merely for simplifying the following discussion and the grouping is in no way limiting. In various example embodiments, the I/O components 910 may include input components 918 and output components 920. The input components 918 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 920 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 910 may include communication components 922 operable to couple the machine 900 to a network 924 or devices 926 via a coupling 928 and a coupling 930 respectively. For example, the communication components 922 may include a network interface component or another suitable device to interface with the network 924. In further examples, the communication components 922 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 926 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time, and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor implemented. For example, at least some of the operations of a method may be performed by one or more processors or processor implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 10:
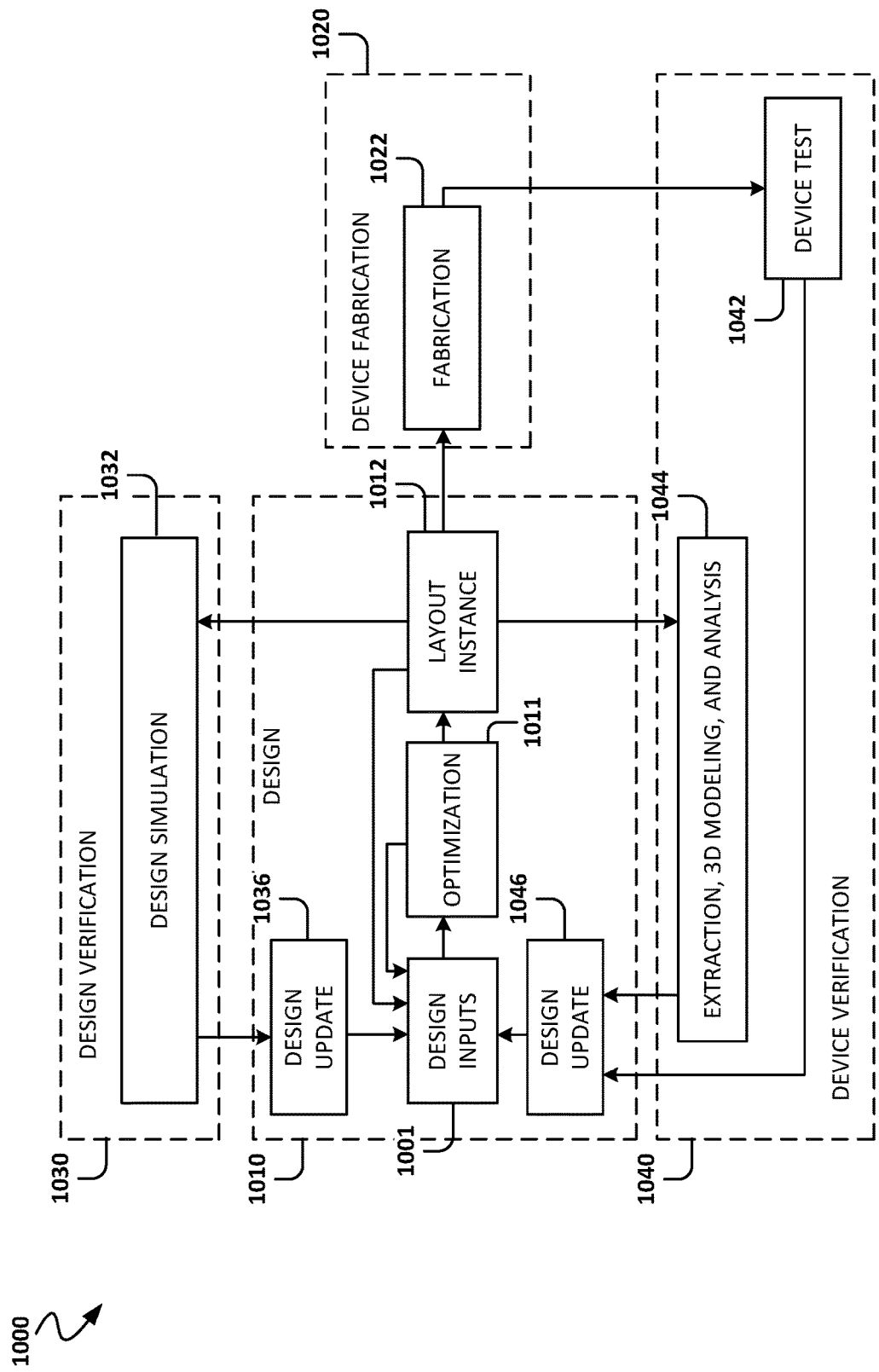
FIG. 10 is a diagram illustrating one possible design process flow for generating a circuit, including embodiments to implement a CTLE with active inductors as described herein, and in various embodiments, to integrate the circuit with a larger circuit.

FIG. 10 is a diagram illustrating one possible design process flow for generating a circuit, including embodiments to implement a CTLE with active inductors as described herein, and in various embodiments, to integrate the circuit with a larger circuit. As illustrated, the overall design flow 1000 includes a design phase 1010, a device fabrication phase 1020, a design verification phase 1030, and a device verification phase 1040. The design phase 1010 involves an initial design input operation 1001 where the basic elements and functionality of a device are determined, as well as revisions based on various analyses and optimization of a circuit design. This design input operation 1001 is where instances of an EDA circuit design file are used in the design and any additional circuitry is selected. The initial strategy, tactics, and context for the device to be created are also generated in the design input operation 1001, depending on the particular design algorithm to be used.

In some embodiments, following an initial selection of design values in the design input operation 1001, timing analysis and optimization according to various embodiments occurs in an optimization operation 1011, along with any other automated design processes. As described below, design constraints for blocks of a circuit design generated with design inputs in the design input operation 1001 may be analyzed using hierarchical timing analysis, according to various embodiments. While the design flow 1000 shows such optimization occurring prior to a layout instance 1012, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1022.

After design inputs are used in the design input operation 1001 to generate a circuit layout, and any optimization operations 1011 are performed, a layout is generated in the layout instance 1012. The layout describes the physical layout dimensions of the device that match the design inputs. This layout may then be used in the device fabrication operation 1022 to generate a device, or additional testing and design updates may be performed using designer inputs or automated updates based on design simulation 1032 operations or extraction, 3D modeling, and analysis 1044 operations. Once the device is generated, the device can be tested as part of device test 1042 operations, and layout modifications generated based on actual device performance.

As described in more detail below, design updates 1036 from the design simulation 1032, design updates 1046 from the device test 1042, the extraction, 3D modeling, and analysis 1044 operations, or the design input operation 1001 may occur after an initial layout instance 1012 is generated. In various embodiments, whenever design inputs are used to update or change an aspect of a circuit design, a timing analysis and optimization operation 1011 may be performed.

For example, in various embodiments, a user may provide an input to a computing device indicating placement of elements of a circuit within a portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
an input for receiving an input signal; and
a continuous time linear equalizer configured to generate an equalized signal based on the input signal, the continuous time linear equalizer having a transfer function that comprises a first pole, a second pole, a third pole, a first zero, and a second zero, the continuous time linear equalizer comprising an equalizer portion and an active inductor portion, the active inductor portion operatively coupling a load of the equalizer portion to a current source, the active inductor portion being configured to implement the first zero and the second zero of the transfer function, the equalizer portion being configured to implement the first pole, the second pole, and the third pole of the transfer function, the first zero being associated with a first input frequency of the transfer function, the second zero being associated with a second input frequency of the transfer function, the first pole being associated with a third input frequency of the transfer function, the second pole being associated with a fourth input frequency of the transfer function, the third pole being associated with a fifth input frequency of the transfer function, the first input frequency being less than the third input frequency, the third input frequency being less than the second input frequency, and the second input frequency being less than the fourth input frequency and the fifth input frequency.

2. The circuit of claim 1, wherein the active inductor portion comprises a transistor device, a resistor, and a capacitor, and wherein the transistor device, the resistor, and the capacitor implement a feedback path in the active inductor portion.

3. The circuit of claim 1, wherein the active inductor portion comprises a first transistor device, a second transistor device, a third transistor device, a resistor, and a capacitor, wherein a gate of the second transistor device is configured to receive a first input voltage bias, wherein a gate of the third transistor device is configured to receive a second input voltage bias, and wherein the third transistor device, the resistor, and the capacitor implement a feedback path in the active inductor portion.

4. The circuit of claim 3, wherein a drain of the first transistor device is operatively coupled to a power source, wherein a source of the first transistor device is operatively coupled to a drain of the second transistor device and to the load of the equalizer portion, wherein a source of the second transistor device is operatively coupled to a drain of the third transistor device and to the capacitor, and wherein a source of the third transistor device is operatively coupled to the resistor and to a gate of the first transistor device.

5. The circuit of claim 1, wherein the active inductor portion comprises a first transistor device, a second transistor device, a third transistor device, a resistor, a capacitor, and a differential amplifier, wherein a drain of the first transistor device is operatively coupled to a power source, wherein a source of the first transistor device is operatively coupled to a drain of the second transistor device, to a negative input of the differential amplifier, and to the load of the equalizer portion, wherein a positive input of the differential amplifier is configured to receive a first input voltage bias, wherein a gate of the second transistor device is operatively coupled to an output of the differential amplifier, wherein a source of the second transistor device is operatively coupled to a drain of the third transistor device and to the capacitor, and wherein a source of the third transistor device is operatively coupled to the resistor and a gate of the first transistor device.

6. The circuit of claim 1, wherein the input signal comprises a differential input signal.

7. A method comprising:
receiving an input signal at a continuous time linear equalizer; and
generating, by the continuous time linear equalizer, an equalized signal based on the input signal, the continuous time linear equalizer having a transfer function that comprises a first pole, a second pole, a third pole, a first zero, and a second zero, the continuous time linear equalizer comprising an equalizer portion and an active inductor portion, the active inductor portion operatively coupling a load of the equalizer portion to a current source, the active inductor portion being configured to implement the first zero and the second zero of the transfer function, the equalizer portion being configured to implement the first pole, the second pole, and the third pole of the transfer function, the first zero being associated with a first input frequency of the transfer function, the second zero being associated with a second input frequency of the transfer function, the first pole being associated with a third input frequency of the transfer function, the second pole being associated with a fourth input frequency of the transfer function, the third pole being associated with a fifth input frequency of the transfer function, the first input frequency being less than the third input frequency, the third input frequency being less than the second input frequency, and the second input frequency being less than the fourth input frequency and the fifth input frequency.

8. The method of claim 7, wherein the active inductor portion comprises a transistor device, a resistor, and a capacitor, and wherein the transistor device, the resistor, and the capacitor implement a feedback path in the active inductor portion.

9. The method of claim 7, wherein the active inductor portion comprises a first transistor device, a second transistor device, a third transistor device, a resistor, and a capacitor, wherein a gate of the second transistor device is configured to receive a first input voltage bias, wherein a gate of the third transistor device is configured to receive a second input voltage bias, and wherein the third transistor device, the resistor, and the capacitor implement a feedback path in the active inductor portion.

10. The method of claim 9, wherein a drain of the first transistor device is operatively coupled to a power source, wherein a source of the first transistor device is operatively coupled to a drain of the second transistor device and to the load of the equalizer portion, wherein a source of the second transistor device is operatively coupled to a drain of the third transistor device and to the capacitor, and wherein a source of the third transistor device is operatively coupled to the resistor and to a gate of the first transistor device.

11. The method of claim 7, wherein the active inductor portion comprises a first transistor device, a second transistor device, a third transistor device, a resistor, a capacitor, and a differential amplifier, wherein a drain of the first transistor device is operatively coupled to a power source, wherein a source of the first transistor device is operatively coupled to a drain of the second transistor device, to a negative input of the differential amplifier, and to the load of the equalizer portion, wherein a positive input of the differential amplifier is configured to receive a first input voltage bias, wherein a gate of the second transistor device is operatively coupled to an output of the differential amplifier, wherein a source of the second transistor device is operatively coupled to a drain of the third transistor device and to the capacitor, and wherein a source of the third transistor device is operatively coupled to the resistor and a gate of the first transistor device.

12. The method of claim 7, wherein the input signal comprises a differential input signal.

13. A non-transitory computer-readable medium comprising instructions that, when executed by one or more processors of a computing device, cause the computing device to generate a circuit design by performing operations comprising:
configuring, in a circuit design, an input for receiving an input signal; and
configuring, in the circuit design, a continuous time linear equalizer configured to generate an equalized signal based on the input signal, the continuous time linear equalizer having a transfer function that comprises a first pole, a second pole, a third pole, a first zero, and a second zero, the continuous time linear equalizer comprising an equalizer portion and an active inductor portion, the active inductor portion operatively coupling a load of the equalizer portion to a current source, the active inductor portion being configured to implement the first zero and the second zero of the transfer function, the equalizer portion being configured to implement the first pole, the second pole, and the third pole of the transfer function, the first zero being associated with a first input frequency of the transfer function, the second zero being associated with a second input frequency of the transfer function, the first pole being associated with a third input frequency of the transfer function, the second pole being associated with a fourth input frequency of the transfer function, the third pole being associated with a fifth input frequency of the transfer function, the first input frequency being less than the third input frequency, the third input frequency being less than the second input frequency, and the second input frequency being less than the fourth input frequency and the fifth input frequency.

14. The non-transitory computer-readable medium of claim 13, wherein the active inductor portion comprises a transistor device, a resistor, and a capacitor, and wherein the transistor device, the resistor, and the capacitor implement a feedback path in the active inductor portion.

15. The non-transitory computer-readable medium of claim 13, wherein the active inductor portion comprises a first transistor device, a second transistor device, a third transistor device, a resistor, and a capacitor, wherein a gate of the second transistor device is configured to receive a first input voltage bias, wherein a gate of the third transistor device is configured to receive a second input voltage bias, and wherein the third transistor device, the resistor, and the capacitor implement a feedback path in the active inductor portion.

16. The non-transitory computer-readable medium of claim 15, wherein a drain of the first transistor device is operatively coupled to a power source, wherein a source of the first transistor device is operatively coupled to a drain of the second transistor device and to the load of the equalizer portion, wherein a source of the second transistor device is operatively coupled to a drain of the third transistor device and to the capacitor, and wherein a source of the third transistor device is operatively coupled to the resistor and to a gate of the first transistor device.

17. The non-transitory computer-readable medium of claim 13, wherein the active inductor portion comprises a first transistor device, a second transistor device, a third transistor device, a resistor, a capacitor, and a differential amplifier, wherein a drain of the first transistor device is operatively coupled to a power source, wherein a source of the first transistor device is operatively coupled to a drain of the second transistor device, to a negative input of the differential amplifier, and to the load of the equalizer portion, wherein a positive input of the differential amplifier is configured to receive a first input voltage bias, wherein a gate of the second transistor device is operatively coupled to an output of the differential amplifier, wherein a source of the second transistor device is operatively coupled to a drain of the third transistor device and to the capacitor, and wherein a source of the third transistor device is operatively coupled to the resistor and a gate of the first transistor device.

18. The non-transitory computer-readable medium of claim 13, wherein the input signal comprises a differential input signal.

\* \* \* \* \*